(12) United States Patent
Naruse

(10) Patent No.: US 9,239,423 B2
(45) Date of Patent: Jan. 19, 2016

(54) IMAGING DEVICE, IMAGING SYSTEM, AND METHOD FOR MANUFACTURING IMAGING DEVICE

(71) Applicant: CANON KABUSHIKI KAISHA, Tokyo (JP)

(72) Inventor: Hiroaki Naruse, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 106 days.

(21) Appl. No.: 13/958,357

(22) Filed: Aug. 2, 2013

(65) Prior Publication Data

US 2014/0044390 A1 Feb. 13, 2014

(30) Foreign Application Priority Data

Aug. 7, 2012 (JP) ................................. 2012-174843

(51) Int. Cl.
*G02B 6/12* (2006.01)
*G02B 6/13* (2006.01)
*H01L 27/146* (2006.01)

(52) U.S. Cl.
CPC .. *G02B 6/12* (2013.01); *G02B 6/13* (2013.01); *H01L 27/14623* (2013.01); *H01L 27/14627* (2013.01); *H01L 27/14629* (2013.01)

(58) Field of Classification Search
CPC .......... G02B 6/30; G02B 6/2835; G02B 6/32; G02B 6/4214; G02B 6/12; G02B 6/26
USPC ..................... 385/14, 15, 31, 39, 51
See application file for complete search history.

(56) References Cited

U.S. PATENT DOCUMENTS 6,127,998 A * 10/2000 Ichikawa et al. ............... 345/100
6,556,258 B1 * 4/2003 Yoshida et al. .................. 349/61

FOREIGN PATENT DOCUMENTS

| CN | 102214668 A | 10/2011 |
|---|---|---|
| CN | 102280460 A | 12/2011 |
| JP | 2006-261249 A | 9/2006 |
| JP | 2008-166677 A | 7/2008 |
| JP | 2010-232595 A | 10/2010 |

\* cited by examiner

*Primary Examiner* — Jennifer Doan
(74) *Attorney, Agent, or Firm* — Canon U.S.A., Inc. IP Division

(57) ABSTRACT

An exemplary embodiment according to the present invention is an imaging device including a substrate in which a plurality of light receiving portions is arranged, an insulator configured to be arranged on the substrate, a plurality of first members configured to be arranged on the substrate so that each of projections of the plurality of first members on the substrate overlaps at least in part with any of the plurality of light receiving portions, and each of the plurality of first members sides is surrounded by the insulator, a second member configured to be arranged on the insulator and the plurality of first members, and a light shielding portion configured to be arranged in the second member.

19 Claims, 12 Drawing Sheets

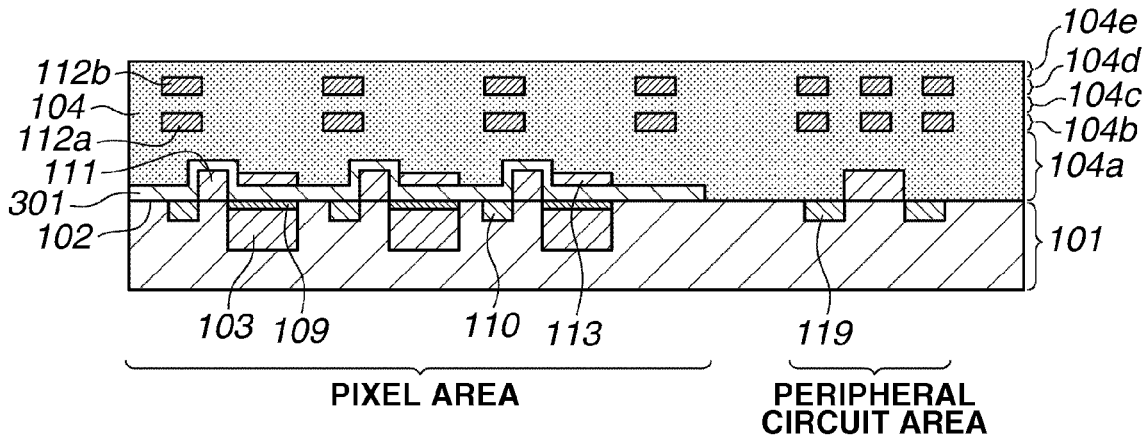
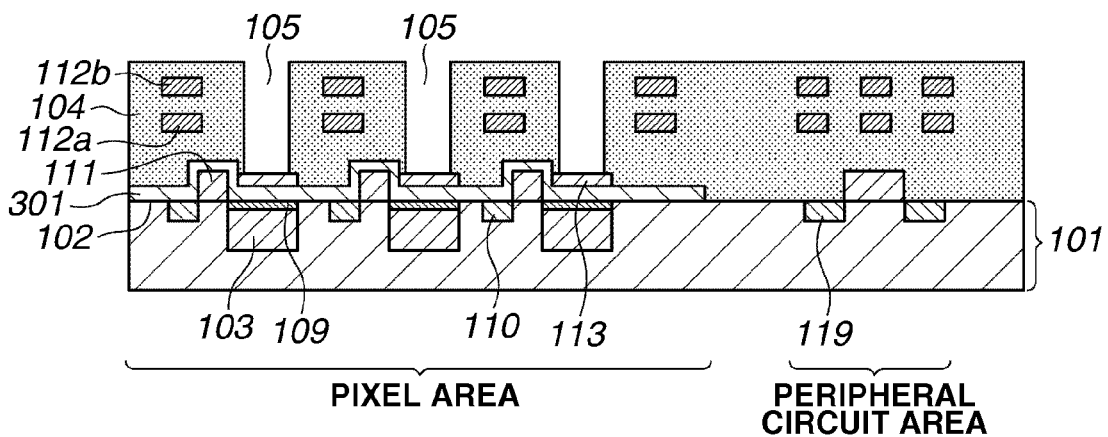
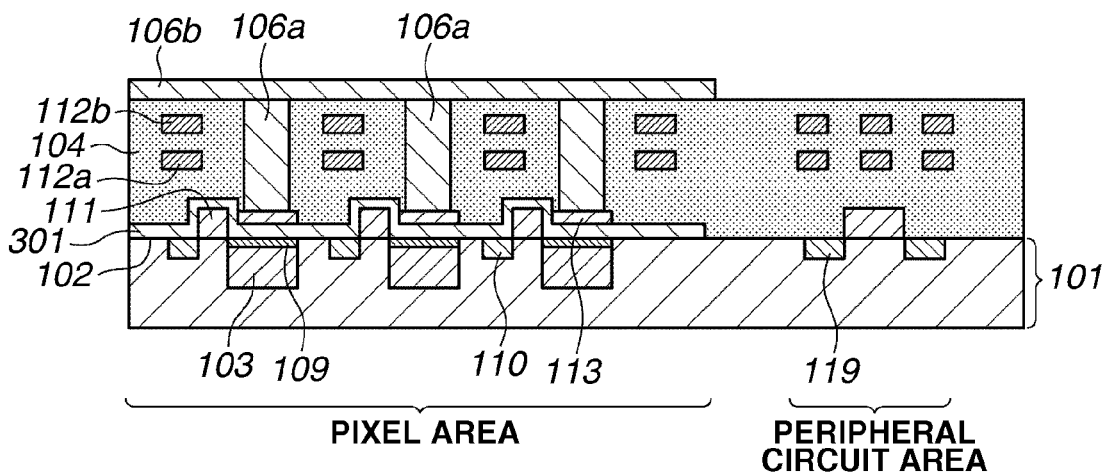

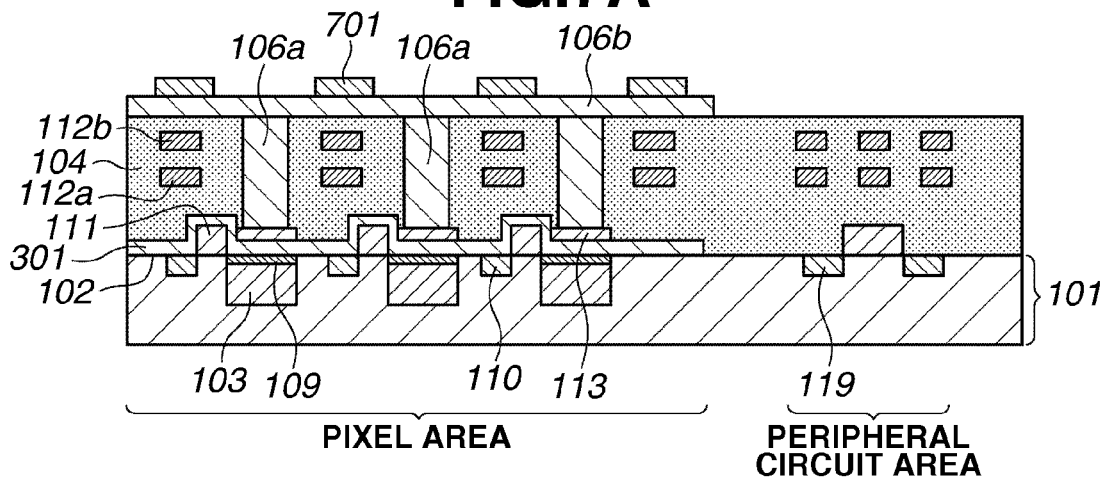
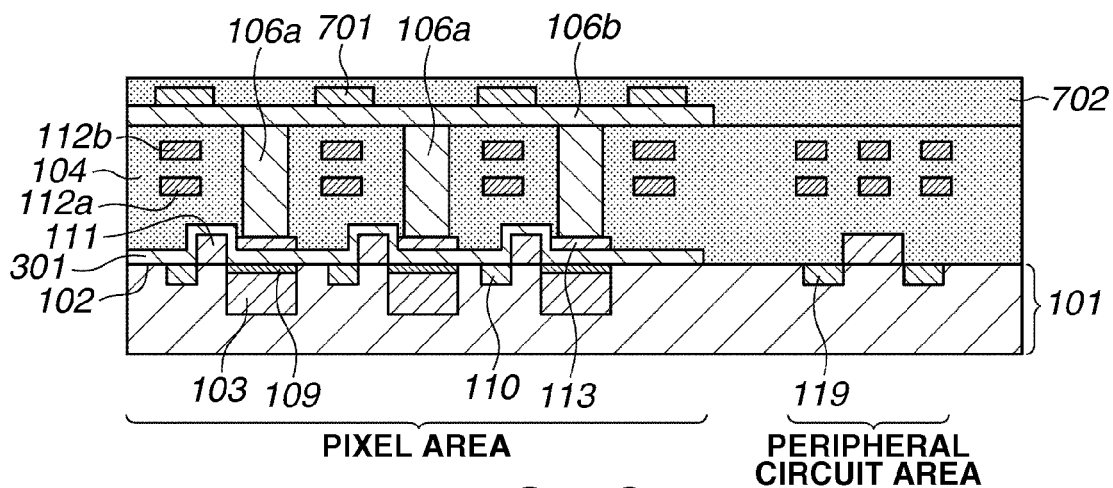
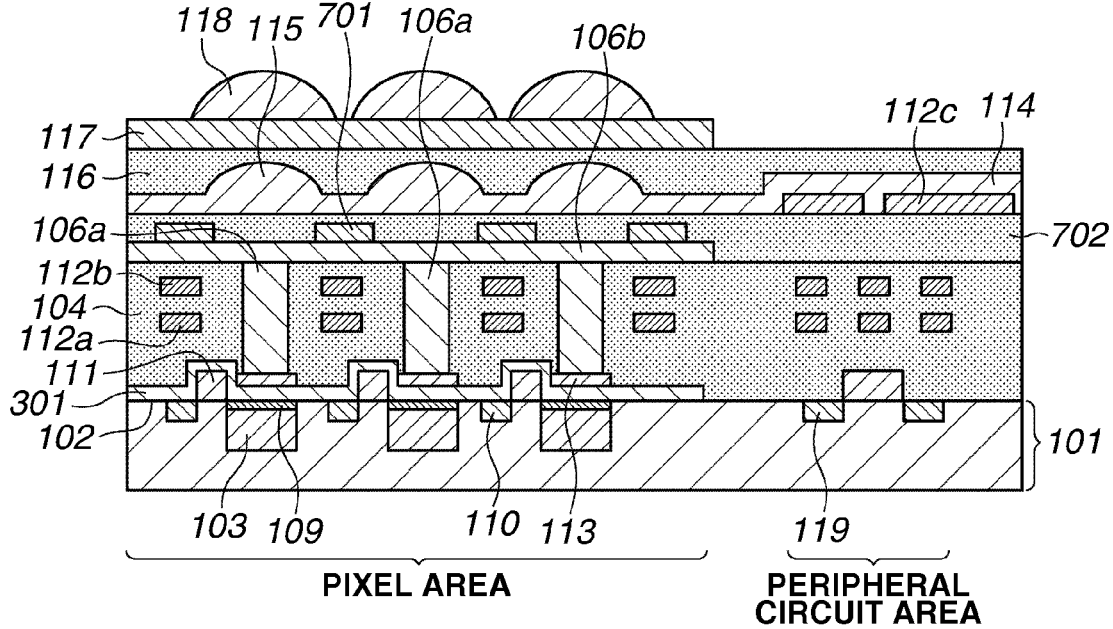

IMAGING DEVICE, IMAGING SYSTEM, AND METHOD FOR MANUFACTURING IMAGING DEVICE

BACKGROUND

1. Field of the Invention

The present invention relates to an imaging device and a method for manufacturing the imaging device.

2. Description of the Related Art

An imaging device including optical waveguides for increasing the amount of light incident on light receiving portions has recently been discussed. Japanese Patent Application Laid-Open No. 2006-261249 discusses an imaging device that includes a plurality of light receiving portions, optical waveguides for guiding light from an object to the light receiving portions, and light shielding portions for preventing incidence of light on adjacent light receiving portions.

SUMMARY OF THE INVENTION

According to an aspect of the present invention, an imaging device includes a substrate in which a plurality of light receiving portions is arranged, an insulator arranged on the substrate, a plurality of first members arranged on the substrate so that a projection of each of the plurality of first members onto the substrate at least partially overlaps with any of the plurality of light receiving portions, each of the plurality of first members being surrounded by the insulator, a second member arranged on the insulator and the plurality of first members, and a light shielding portion arranged in the second member.

According to another aspect of the present invention, an imaging device includes a substrate in which a plurality of light receiving portions is arranged, an insulator arranged on the substrate, a plurality of first members arranged on the substrate so that a projection of each of the plurality of first members onto the substrate at least partially overlaps with any of the plurality of light receiving portions, each of the plurality of first members being surrounded by the insulator, and a refractive index of the plurality of first members being higher than that of the insulator, a connection member arranged on the insulator so as to connect two adjoining first members among the plurality of first members, a refractive index of the connection member being higher than that of the insulator, and a light shielding portion arranged on the connection member.

According to yet another aspect of the present invention, a method for manufacturing an imaging device includes preparing a substrate in which a plurality of light receiving portions is arranged and on which an insulator is arranged, forming a plurality of first openings corresponding to the plurality of light receiving portions in the insulator, forming first members in the plurality of first openings respectively, forming a second member on the insulator and the plurality of first members, forming a plurality of second openings in the second member, and forming light shielding portions in the plurality of second openings respectively.

According to yet another aspect of the present invention, a method for manufacturing an imaging device includes preparing a substrate in which a plurality of light receiving portions is arranged and on which an insulator is arranged, forming a plurality of first members arranged on the substrate so that a projection of each of the plurality of first members onto the substrate at least partially overlaps with any of the plurality of light receiving portions, each of the plurality of first members being surrounded by the insulator, forming a second member arranged on the insulator and on the plurality of first members, a refractive index of the second member being lower than that of the first members, and forming a light shielding portion arranged between a first portion and a second portion of the second member, wherein a projection of the light shielding portion onto the substrate lies between projections, onto the substrate, of two adjoining first members among the plurality of first members.

Further features and aspects of the present invention will become apparent from the following description of exemplary embodiments with reference to the attached drawings.

BRIEF DESCRIPTION OF THE DRAWINGS

FIGS. 3A, 3B, and 3C are diagrams illustrating a method for manufacturing an imaging device according to the first exemplary embodiment and a second exemplary embodiment.

FIGS. 7A, 7B, and 7C are diagrams illustrating a method for manufacturing an imaging device according to a third exemplary embodiment.

DESCRIPTION OF THE EMBODIMENTS

Figure 1:
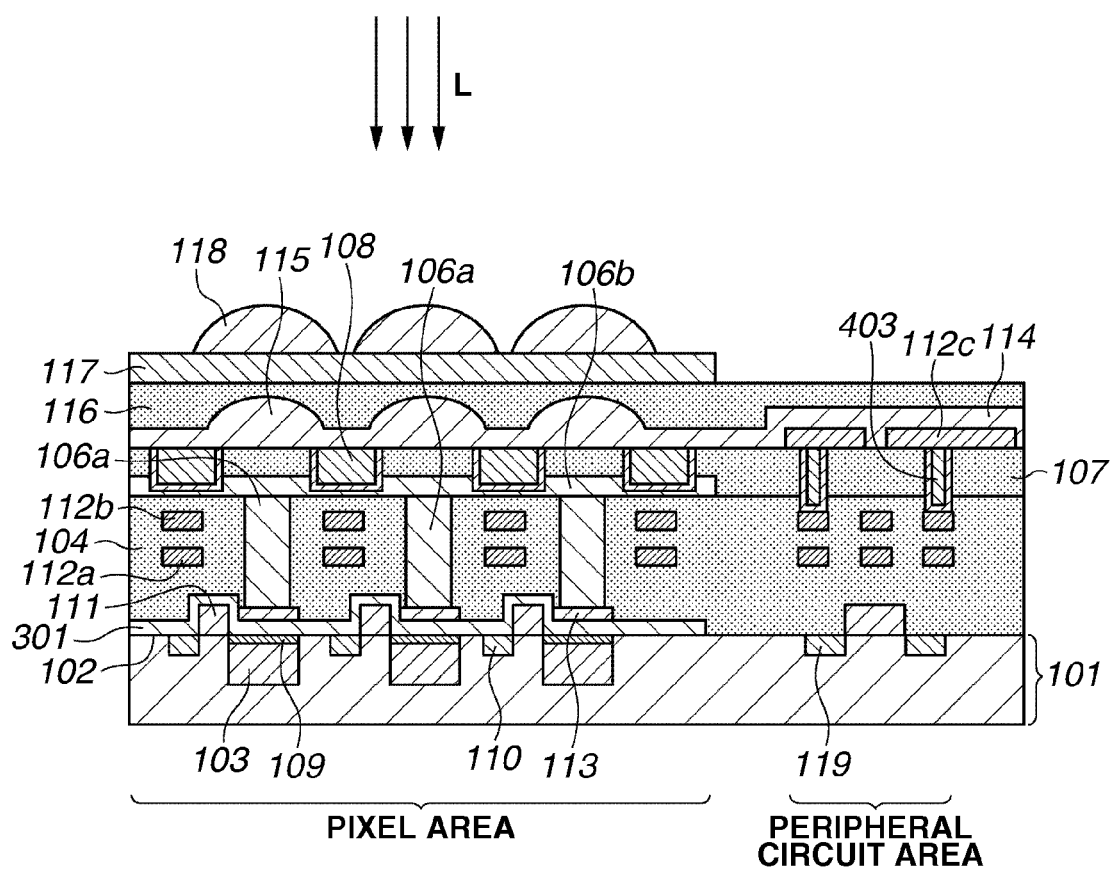
FIG. 1 is a schematic diagram illustrating a cross-sectional structure of an imaging device according to a first exemplary embodiment.

An exemplary embodiment of the present invention is an imaging device including waveguides. More specifically, the imaging device includes a substrate in which a plurality of light receiving portions is arranged. The substrate may be a semiconductor substrate such as silicon and germanium. The light receiving portions may be photoelectric conversion units such as a photodiode.

A plurality of waveguides is arranged corresponding to the plurality of light receiving portions. The waveguides may include a conventional structure. For example, the waveguides may each include an insulator arranged on the substrate, and a first member whose sides are surrounded by the insulator and that has a refractive index higher than that of the insulator. Alternatively, the waveguides may each include an air gap or a reflecting member that is arranged between the insulator arranged on the substrate and the first member arranged with its sides surrounded by the insulator.

An exemplary embodiment is characterized by a relationship between the refractive index of a member in which light shielding portions are arranged and that of the waveguides, or a relationship between the refractive index of the member in which the light shielding portions are arranged and that of a member arranged on or under the member. For example, a second member is arranged on the waveguides. Light shielding portions are arranged in the second member. The second member may have a refractive index lower than that of the first members which constitute the waveguides. Alternatively, a third member is arranged between the second member and the waveguides. The second member may have a refractive index lower than that of the third member. Alternatively, a fourth member having a refractive index different from that of the second member may be arranged on the second member. The light shielding portions may be made of a conventional material. For example, the light shielding portions may be made of metal.

Another exemplary embodiment is an imaging device including a connection member that is arranged on the waveguides to connect adjoining waveguides. For example, the connection member is made of the same material as that of the first members which constitute the waveguides. The first members and the connection member may be formed by the same process. In such an exemplary embodiment, the light shielding portions are arranged on the connection member. The light receiving portions may be made of a conventional material. For example, the light shielding portions may be made of metal.

Japanese Patent Application Laid-Open No. 2006-261249 includes no discussion about the refractive index of the member where the light shielding portions are arranged. The imaging devices discussed in Japanese Patent Application Laid-Open No. 2006-261249 can thus cause mixing of light into the adjoining light receiving portions. In particular, in the imaging device illustrated in FIG. 2A of Japanese Patent Application Laid-Open No. 2006-261249, a high refractive index member constituting the optical waveguides is arranged on the light receiving portions. Part of the high refractive index member extends even over the light shielding portions. Since the high refractive index member arranged on the light shielding portions is not shielded from light, oblique light tends to be incident thereon. If light is incident on the high refractive index member arranged on the light shielding portions, the light can propagate through the high refractive index member and enter adjacent optical waveguides. This can cause the mixing of light into the adjoining light receiving portions.

The mixing of light into the adjoining light receiving portions can produce noise and cause a drop in image quality. According to some of the exemplary embodiments of the present invention, the mixing of light can be reduced to improve the image quality.

The exemplary embodiments of the present invention will be described in more detail below. Note that the present invention is not limited to only the exemplary embodiments described below. Modifications in which a part of the configuration of the following exemplary embodiments is modified without departing from the gist of the present invention also constitute exemplary embodiments of the present invention. Examples in which a part of the configuration of any one of the following exemplary embodiments is added to another exemplary embodiment and/or examples in which a part of the configuration of any one of the following exemplary embodiments is replaced with a part of the configuration of another exemplary embodiment also constitute exemplary embodiments of the present invention.

Figure 2:
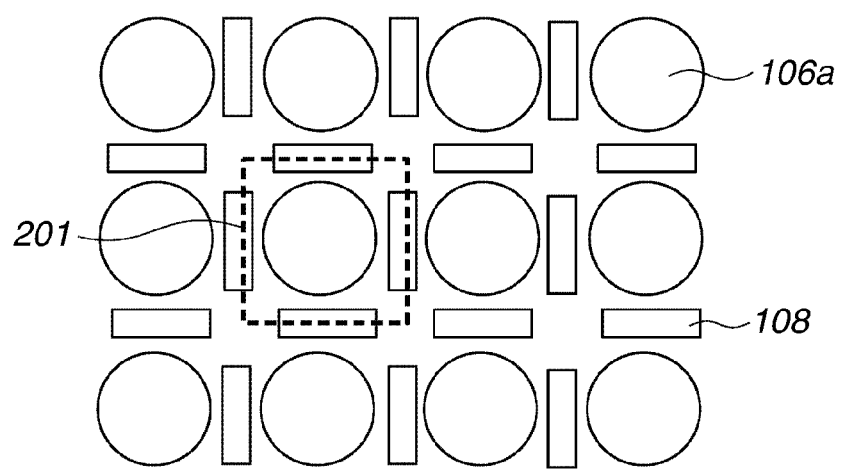
FIG. 2 is a schematic diagram illustrating a planar layout of the imaging device according to the first exemplary embodiment.

A first exemplary embodiment will be described. The first exemplary embodiment of the present invention will be described with reference to the drawings. FIGS. 1 and 2 are schematic diagrams illustrating a cross-sectional structure and a planar layout of an imaging device according to the present exemplary embodiment, respectively.

FIG. 1 illustrates three pixels arranged in a pixel area and a transistor arranged in a peripheral circuit area. In fact, the pixel area includes a plurality of pixels arranged in a matrix. The peripheral circuit area includes a plurality of transistors including ones having semiconductor regions of opposite conductivity types.

The following description deals with a case where signal charges are electrons. However, the signal charges may be holes. If the signal charges are holes, the semiconductor regions are replaced with ones of opposite conductivity types.

In the present exemplary embodiment, a semiconductor substrate 101 is an N-type silicon layer formed by epitaxial growth. The semiconductor substrate 101 includes P-type semiconductor regions and N-type semiconductor regions. The semiconductor substrate 101 has a main surface 102. In the present exemplary embodiment, the main surface 102 is an interface between the semiconductor substrate 101 and a thermally-oxidized film (not-illustrated) stacked on the semiconductor substrate 101. Light is incident on the semiconductor substrate 101 through the main surface 102. The incident direction of the light is indicated by the arrows L.

light receiving portions 103 are photodiodes for example. In the present exemplary embodiment, a plurality of the light receiving portions 103 is arranged in the semiconductor substrate 101. In the present exemplary embodiment, the light receiving portions 103 are N-type semiconductor regions constituting photodiodes. Charges generated by photoelectric conversion are collected to the N-type semiconductor regions. P-type semiconductor regions 109 are arranged in contact with the main surface 102 of the semiconductor substrate 101.

Floating diffusions (FDs) 110 are N-type semiconductor regions. The charges generated by the light receiving portions 103 are transferred to the FDs 110 and converted into voltages. The FDs 110 are electrically connected to input nodes of a not-illustrated amplification portion. Amplification portions may be arranged for the respective pixels. Alternatively, the FDs 110 are electrically connected to not-illustrated signal output lines.

Gate electrodes 111 are arranged on the semiconductor substrate 101 via the not-illustrated thermally-oxidized film. The gate electrodes 111 arranged between the light receiving portions 103 and the FDs 111 are transfer gate electrodes for controlling transfer of charges between the light receiving portions 103 and the FDs 110. The peripheral circuit area includes source regions 119 and drain regions 119 of the transistor.

In FIG. 1, an insulator 104 is arranged on the semiconductor substrate 101. In the present exemplary embodiment, the insulator 104 is a silicon oxide film. The insulator 104 may have a refractive index of 1.40 to 1.60. A first wiring layer 112*a* a second wiring layer 112*b*, and a third wiring layer 112*c* are arranged on the semiconductor substrate 101. The first wiring layer 112*a*, the second wiring layer 112*b*, and the third wiring layer 112*c* are located at different heights with respect to the main surface 102 of the semiconductor substrate 101.

In the present exemplary embodiment, conductive members included in the first wiring layer 112a and the second wring layer 112b mainly contain copper. Conductive members included in the third wiring layer 112c mainly contain aluminum. The third wiring layer 112c includes conductive members that constitute pads and a wiring layer of the peripheral circuit area. The conductive members included in each wiring layer may be made of conductive materials other than copper or aluminum. Some of the conductive members of the first wiring layer 112a and some of the conductive members of the second wiring layer 112b are electrically connected by not-illustrated plugs. Some of the conductive members of the second wiring layer 112b and some of the conductive members of the third wiring layer 112c are electrically connected by plugs 403.

The plugs 403 are made of a conductive material such as tungsten. The insulator 104 insulates the conductive members of the first wiring layer 112a, the conductive members of the second wiring layer 112b, and the conductive members of the third wiring layer 112c from each other except the portions electrically connected by the plugs. The insulator 104 may include a plurality of interlayer insulating films. The plurality of interlayer insulating films includes an interlayer insulating film arranged between the semiconductor substrate 101 and the first wiring layer 112a, an interlayer insulating film arranged between the first wiring layer 112a and the second wiring layer 112b, and/or an interlayer insulating film arranged on the second wiring layer 112b. In the present exemplary embodiment, the third wiring layer 112c is located farthest from the semiconductor substrate 101 among the plurality of wiring layers 112a, 112b, and 112c. Note that the number of wiring layers is not limited to three.

In FIG. 1, in the present exemplary embodiment, first members 106a constitute waveguides for guiding light. The first members 106a will hereinafter be referred to as waveguide members 106a. The waveguide members 106a are arranged so that their sides are surrounded by the insulator 104. In other words, when seen in a cross section taken along a plane parallel to the main surface 102 of the substrate 101, the waveguide members 106a are surrounded by the insulator 104. A connection member 106b made of the same material as that of the waveguide members 106a is arranged on the waveguide members 106a and the insulator 104. In the present exemplary embodiment, the waveguide members 106a and the connection member 106b are silicon nitride films. Alternatively, the waveguide members 106a and the connection member 106b may be made of a silicon oxynitride film or an organic material (resin such as a polyimide system polymer). The waveguide members 106a and the connection member 106b may be made of different materials. For example, the waveguide members 106a may be a silicon nitride film, and the connection member 106b may be a silicon oxynitride film.

In the present exemplary embodiment, the waveguide members 106a and the connection member 106b both have a refractive index higher than that of the insulator 104. Specifically, the waveguide members 106a and the connection member 106b both have a refractive index equal to or more than 1.60. Since the waveguide members 106a have a refractive index higher than that of the insulator 104, light incident on the interfaces between the waveguide members 106a and the insulator 104 is reflected based on the Snell's law. The waveguide members 106a can thus confine light inside. In other words, the waveguide members 106a can function as waveguides for guiding the incident light to the light receiving portions 103. Silicon nitride films can be configured to have a high hydrogen content. The waveguide members 106a made of silicon nitride films can thus terminate dangling bonds of the semiconductor substrate 101 by a hydrogen supply effect. Consequently, noise such as white defects can be reduced. Polyimide system organic materials have a refractive index of approximately 1.7. Polyimide system organic materials have embedding characteristics superior to those of silicon nitride films. With a refractive index in the range of 1.80 to 2.40, the waveguide members 106a can provide improved waveguide performance.

The waveguide members 106a may be configured to contain a plurality of materials. In such a case, any one of the plurality of materials may have a refractive index higher than that of the insulator 104. For example, the waveguide members 106a may each include a silicon nitride film and a silicon oxynitride film. The waveguide members 106a may be each configured so that a silicon nitride film is arranged near the sides and bottom of the waveguide members 106a, and an organic material is arranged in the other region. As illustrated in FIG. 1, the connection member 106b need not be arranged in the peripheral circuit area.

Unlike the present exemplary embodiment, waveguides may be formed by arranging an air gap or a reflecting member between the waveguide members 106a and the insulator 104. In such an exemplary embodiment, the refractive index of the waveguide members 106a is not limited in particular. In such an exemplary embodiment, the waveguide members 106a may simply be made of a light-transmitting material.

In FIG. 1, etch stop members 113 are arranged between the waveguide members 106a and the semiconductor substrate 101. The etch stop members 113 are layers intended to accurately stop etching when making openings for the waveguide members 106a to be arranged in the insulator 104. The etch stop members 113 may be layers for retarding the progress of the etching. The etch stop members 113 and the waveguide members 106a are in contact with each other. The etch stop members 113 are formed of different material from the insulator 1104. In the present exemplary embodiment, the etch stop members 113 are silicon nitride films. The etch stop members 113 may be omitted depending on the etching condition.

In FIG. 1, a second member 107 is arranged on the insulator 104 and the waveguide members 106a. In the present exemplary embodiment, the second member 107 is a silicon oxide film. The second member 107 has a refractive index lower than that of the waveguide members 106a. Specifically, the refractive index of the second member 107 falls within the range of 1.40 to 1.60.

In the present exemplary embodiment, the connection member 106b is arranged between the second member 107 and the waveguide members 106a. The connection member 106 has a refractive index higher than that of the second member 107. That is, the connection member 106b is a third member.

Another member having a refractive index higher than that of the second member 107 may be arranged between the connection member 106b and the second member 107. An example of the another member is a silicon oxynitride film.

In FIG. 1, shown are light shielding portions 108. In the present exemplary embodiment, at least part of the light shielding portion 108 is arranged in the second member 107. More specifically, when seen in a cross section, each of the light shielding portions 108 is arranged between two portions of the second member 107. The light shielding portions 108 are made of a metal, alloy, or organic material that does not transmit light. The material of the light shielding portions 108 may have a high reflectance to light having a wavelength of 400 to 600 nm. In the present exemplary embodiment, the light shielding portions 108 contain tungsten. The light shielding portions 108 may be made of the same material as that of the plugs 403 which electrically connect the conductive members included in the second wiring layer 112b with the conductive members included in the third wiring layers 112c. If the light shielding portions 108 and the plugs 403 are made of the same material, both can be formed by the same step, which allows process simplification. In the present exemplary embodiment, the light shielding portions 108 and the plugs 403 are made of the same material and formed by the same step.

In the present exemplary embodiment, the light shielding portions 108 each include a first portion made of a metal or alloy, and a second portion. The second portion is arranged to reduce diffusion of the metal included in the first portion. Specifically, the second portion has a diffusion coefficient lower than that of the insulator 104 with respect to the diffusion of the metal included in the first portion. The second portion may be made of a barrier metal as it is called. The plugs 403 may also be configured to include a first portion and a second portion.

A fourth member 114 and first lenses 115 are arranged on the second member 107. The fourth member 114 can function as a protection film. In the present exemplary embodiment, the fourth member 114 and the first lenses 115 are made of a silicon nitride film. In the present exemplary embodiment, the fourth member 114 and the first lenses 115 both have a refractive index higher than that of the second member 107. Note that the fourth member 114 has only to have a refractive index different from that of the second member 107. The fourth member 114 and the first lenses 115 need not necessarily be arranged. A planarization film 116, a color filter 117, and second lenses 118 may be arranged on the first lenses 115.

The second member 107 may have a refractive index lower than that of the first lenses 115. In the present exemplary embodiment, the silicon nitride film constituting the first lenses 115 has a refractive index of approximately equal to or more than 1.60. The silicon oxide film constituting the second member 107 has a refractive index in the range of 1.40 to 1.60. Such a relationship of the refractive indexes can improve sensitivity to obliquely incident light. The reason is as follows: Obliquely incident light may fail to be sufficiently condensed by the first lenses 115, in which case the light will not be incident on the waveguide members 106a. If the second member 107 having a refractive index lower than that of the first lenses 115 is arranged between the first lenses 115 and the waveguide members 106a, the light transmitted through the first lenses 115 is refracted toward the waveguide members 106a at the interfaces between the first lenses 115 and the second member 107. As a result, the obliquely incident light is incident on the waveguide members 106a, whereby the sensitivity to the obliquely incident light can be improved.

Figure 10:
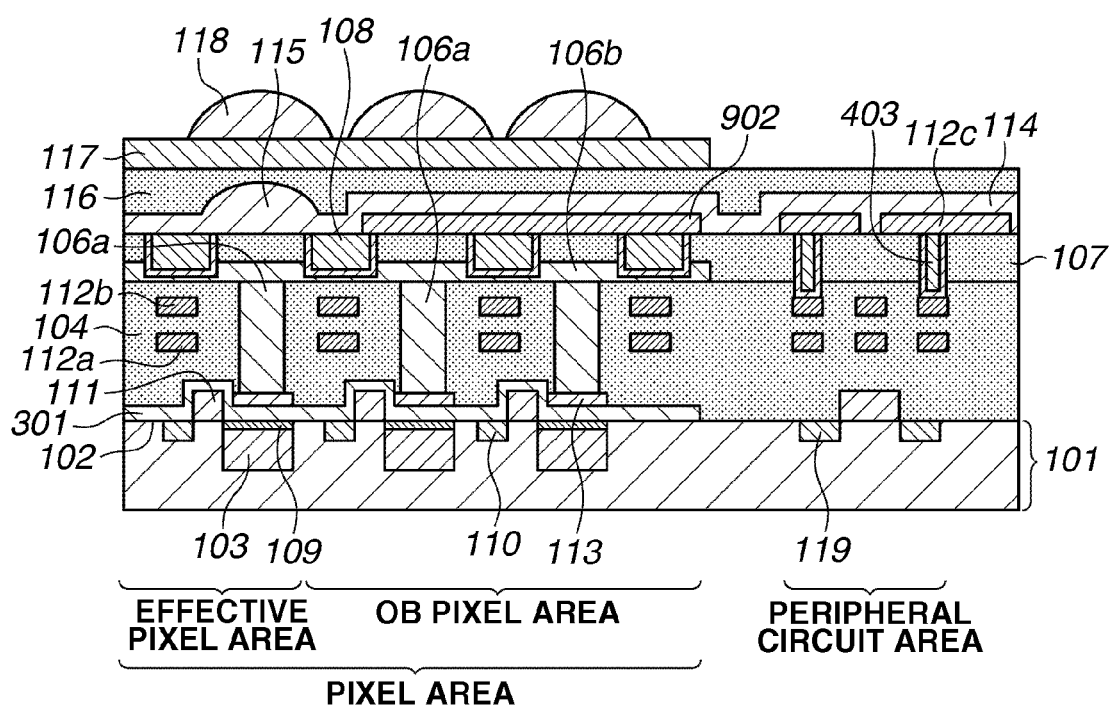
FIG. 10 is a schematic diagram illustrating a cross-sectional structure of the imaging device according to the first exemplary embodiment.

FIG. 10 is a schematic diagram illustrating a sectional structure of another part of the imaging device according to the present exemplary embodiment. Portions having similar functions to those of FIG. 1 are designated by the same reference numerals. The pixel area according to the present exemplary embodiment includes an effective pixel area and an optical black (OB) pixel area. FIG. 10 illustrates a cross section of a pixel included in the effective pixel area and a cross section of pixels included in the OB pixel area.

The optical black pixels are arranged in the OB pixel area. Specifically, a light shielding portion 902 is arranged over the light receiving portions 103 of the pixels included in the OB pixel area. The light shielding portion 902 shields the light receiving portions 103 of the pixels included in the OB pixel area from incident light. The light shielding portion 902 is made of the conductive material included in the third wiring layer 112c. Note that the OB pixel area is provided according to need. The pixel area need not include the OB pixel area.

Next, a positional relationship between the light shielding portions 108, the light shielding portion 902, and the third wiring layer 112c according to the present exemplary embodiment will be described. In the present exemplary embodiment, the light shielding portions 108 are arranged closer to the semiconductor substrate 101 than the third wiring layer 112c which is located farthest from the semiconductor substrate 101 among the plurality of wiring layers 112a to 112c. More specifically, the distance from the main surface 102 of the semiconductor substrate 101 to the bottom surfaces of the light shielding portions 108 is smaller than the distance from the main surface 102 of the semiconductor substrate 101 to the bottom surfaces of the conductive members included in the third wiring layer 112c. The light shielding portions 108 are also arranged closer to the semiconductor substrate 101 than the light shielding portion 902. More specifically, the distance from the main surface 102 of the semiconductor substrate 101 to the bottom surfaces of the light shielding portions 108 is smaller than the distance from the main surface 102 of the semiconductor substrate 101 to the bottom surface of the light shielding portion 902. As illustrated in FIG. 10, the distance from the main surface 102 of the semiconductor substrate to the top surfaces of the light shielding portions 108 is equal to the distance from the main surface 102 of the semiconductor substrate 101 to the bottom surface of the light shielding portion 902. Incidentally, the distance from the main surface 102 of the semiconductor substrate 101 to the top surfaces of the light shielding portions 108 may be greater than the distance from the main surface 102 of the semiconductor substrate 101 to the bottom surface of the light shielding portion 902.

In FIGS. 1 and 10, the bottom surfaces of the light shielding portions 108 are located closer to the semiconductor substrate 101 than the top surface of the connection member 106b is. In other words, the light shielding portions 108 are partly arranged in the connection member 106b. However, the bottom surfaces of the light shielding portions 108 may be located farther from the semiconductor substrate 101 than the top surface of the connection member 106b is. In other words, part of the second member 107 may be arranged between the light shielding portions 108 and the connection member 106b. Alternatively, the bottom surfaces of the light shielding portions 108 may be located in the same position as that of the top surface of the connection member 106b.

As illustrated in FIGS. 1 and 10, in the present exemplary embodiment, both the top surfaces of the light shielding portion 108 and the top surface of the second member 107 are in contact with the fourth member 114. However, part of the second member 107 may be arranged between the light shielding portions 108 and the fourth member 114. In such a case, the light shielding portions 108 and the second member 114 are not in contact with each other.

FIG. 2 illustrates a planar layout diagram of the waveguide members and the light shielding portions according to the present exemplary embodiment. In FIG. 2, portions having similar functions to those of FIG. 1 are designated by the same reference numerals. A detailed description thereof will be omitted. In FIG. 2, the dotted line 201 represents a pixel. A pixel 201 includes a light receiving portion 103 (not illustrated in FIG. 2) and a waveguide member 106a. Each light shielding portion 108 is arranged between two adjoining waveguide members 106a. More specifically, the light shielding portion 108 is arranged so that a projection of the light shielding portion 108 on the semiconductor substrate 101 overlaps at least in part with a projection, on the semiconductor substrate 101, of a portion of the insulator 104 arranged between the two adjoining first members 106a.

In the present exemplary embodiment, pixels 201 each having a square shape are two-dimensionally arranged in a matrix as illustrated in FIG. 2. Light incident on such a group of horizontally and vertically arranged pixels includes light incident perpendicularly to the plane of FIG. 2 and obliquely incident light. The light shielding portions 108 are arranged in between the adjoining waveguide members 106a so that the obliquely incident light passed through on chip lenses (the first lenses 115) of horizontally and vertically adjoining pixels will not leak in.

The light shielding portions 108 may be arranged not to overlap the insulator 104. For example, the light shielding portions 108 may be arranged on the waveguide members 106a along the outer circumferences of the waveguide members 106a. Even with such an arrangement, the light shielding portions 108 can suppress the mixing of light into the adjoining waveguide members 106a.

Next, a manufacturing method according to the present exemplary embodiment will be described with reference to FIGS. 3A, 3B, and 3C to FIGS. 5A and 5B. In FIGS. 3A, 3B, and 3C to FIGS. 5A and 5B, portions having similar functions to those of FIGS. 1, 2, and 10 are designated by the same reference numerals. A detailed description thereof will be omitted.

FIG. 3A illustrates a step of preparing the semiconductor substrate 101 in which the plurality of light receiving portions 103 is arranged and on which the insulator 104 is arranged. More specifically, in the step illustrated in FIG. 3A, semiconductor regions are formed in the semiconductor substrate 101. The gate electrodes 111, the insulator 104, the etch stop members 113, the first wiring layer 112a, and the second wiring layer 112b are formed on the semiconductor substrate 101.

In this step, the light receiving portions 103 are initially formed in the semiconductor substrate 101. The gate electrodes 111 are formed on the semiconductor substrate 101. The FDs 110 and the semiconductor regions 119 constituting a source and a drain are then formed.

Next, a protection layer 301 is formed on the main surface 102 side of the light receiving portions 103. For example, the protection layer 301 is a silicon nitride film. The protection film 301 may include a plurality of layers including a silicon nitride film and a silicon oxide film. The protection layer 301 may have a function for reducing possible damage to the light receiving portions 103 in subsequent steps. The protection layer 301 may have an antireflection function.

The etch stop member 113 are formed on a side of the protection layer 301 opposite from the semiconductor substrate 101. The etch stop members 301 can have a greater area than that of the bottoms of openings 105 to be formed later. The etch stop member 301 need not be formed in regions other than where the bottoms of the openings 105 are formed. The protection layer 301 and the etch stop members 113 need not necessarily be formed.

Next, the insulator 104, the first wiring layer 112a, and the second wiring layer 112b are formed. In the present exemplary embodiment, the first wiring layer 112a and the second wiring layer 112b are formed by dual damascene method. The formation will be described by using a case where the insulator 104 includes a plurality of interlayer insulating films 104a to 104e as an example. For the sake of convenience, the plurality of interlayer insulating films 104a to 104e will be referred to as first to fifth interlayer insulating films 104a to 104e in order from the one closet to the semiconductor substrate 101.

The first interlayer insulating film 104a is formed over the entire surface of the pixel area and the peripheral circuit area. A surface of the first interlayer insulating film 104a on the side opposite from the semiconductor substrate 101 may be planarized if needed. Not-illustrated contact holes are formed in the first interlayer insulating film 104a. Plugs for electrically connecting conductive members of the first wiring layer 112a and semiconductor regions of the semiconductor substrate 101 are arranged in the contact holes.

Next, the second interlayer insulating film 104b is formed on a side of the first interlayer insulating film 104a opposite from the semiconductor substrate 101. Portions of the second interlayer insulating film 104b corresponding to the regions where the conductive members of the first wiring layer 112a are to be arranged are removed by etching. A metal film for forming the first wiring layer 112a is formed on the pixel area and the peripheral circuit area. The metal film is then removed by chemical mechanical polishing (CMP) until the second interlayer insulating film 104b is exposed. By such a procedure, a predetermined pattern of conductive members constituting the wiring of the first wiring layer 112a is formed.

Next, the third interlayer insulating film 104c and the fourth interlayer insulating film 104d are formed on the pixel area and the peripheral circuit area. Portions of the fourth interlayer insulating film 104d corresponding to the regions where the conductive members of the second wiring layer 112b are to be arranged are removed by etching. Next, portions of the third interlayer insulating film 104c corresponds to the regions where the plugs for electrically connecting the conductive members of the first wiring layer 112a and the conductive members of the second wiring layer 112b are to be arranged are removed by etching. A metal film for forming the second wiring layer 112b and the plugs is formed on the pixel area and the peripheral circuit area. The metal film is then removed by CMP until the fourth interlayer insulting film 104d is exposed. By such a procedure, the wiring pattern of the second wiring layer 112b and a plug pattern are formed. Note that after the formation of the third interlayer insulating film 104c and the fourth interlayer insulating film 104d, portions corresponding to the regions where the plugs for electrically connecting the conductive members of the first wiring layer 112a and the conductive members of the second wiring layer 112b are to be arranged may be first removed by etching.

Next, the fifth interlayer insulating film 104e is formed on the pixel area and the peripheral circuit area. A surface of the fifth interlayer insulating film 104e on the side opposite from the semiconductor substrate 101 may be planarized by CMP if needed.

An etch stop film, a metal diffusion prevention film, or a film having both functions may be arranged between the interlayer insulating films 104a to 104e. Specifically, if the insulator 104 is a silicon oxide film, a silicon nitride film may be arranged as a metal diffusion prevention film.

The first wiring layer 112a and the second wiring layer 112b may be formed by a technique other than the damascene method. An example of the technique other than the damascene method will be described. After the formation of the first interlayer insulating film 104a, a metal film for forming the first wiring layer 112a is formed on the pixel area and the peripheral circuit area. Portions of the metal film other than the regions where the conductive members of the first wiring layer 112a are to be arranged are removed by etching. This forms the wiring pattern of the first wiring layer 112a. Subsequently, the second interlayer insulating film 104b and the third interlayer insulating film 104c are formed, and the second wiring layer 112b is formed in a similar manner. After the formation of the second wiring layer 112b, the fourth interlayer insulating film 104d and the fifth interlayer insulating film 104e are formed. Surfaces of the third interlayer insulating film 104c and the fifth interlayer insulating film 104e on the side opposite from the semiconductor substrate 101 are planarized if needed.

FIG. 3B illustrates a step of forming a plurality of openings 105 in the insulator 104. The plurality of openings 105 is formed in positions corresponding to the plurality of light receiving portions 103. Initially, a not-illustrated etch mask pattern is formed on a side of the insulator 104 opposite from the semiconductor substrate 101. The etch mask pattern is arranged in regions other than where the openings 105 are to be arranged. In other words, the etch mask pattern has openings in the regions where the openings 105 are to be arranged. An example of the etch mask pattern is a photoresist patterned by photolithography and development.

Subsequently, the insulator 104 is etched by using the etch mask pattern as a mask. This forms the openings 105. After the etching of the insulator 104, the etch mask pattern is removed.

If the etch stop members 113 are arranged, the etching is performed until the etch stop members 113 are exposed in FIG. 3B. Under an etching condition for etching the insulator 104, the etch stop members 113 have an etching rate lower than that of the insulator 104 under the same condition. If the insulator 104 is a silicon oxide film, the etch stop members 113 may be a silicon nitride film or a silicon oxynitride film. The etch stop members 113 may be exposed by a plurality of times of etching with different conditions.

FIG. 3C illustrates a step of forming the waveguide members 106a in the respective plurality of openings 105. In the present exemplary embodiment, the waveguide members 106a and the connection member 106b are formed in the step of FIG. 3C. The material of the waveguide members 106a and the connection member 106b is deposited on the pixel area and the peripheral circuit area. This forms the waveguide members 106a in the openings 105, and the connection member 106b on the waveguide members 106a and the insulator 104. An example of the material of the waveguide members 106a and the connection member 106b is a silicon nitride film. The material of the waveguide members 106a and the connection member 106b can be deposited by film formation such as chemical vapor deposition (CVD) and sputtering, or by application of organic material such as a polyimide system polymer. After the deposition of the material of the waveguide members 106a and the connection member 106b, planarization may be performed by using etch back or CMP. In the present exemplary embodiment, CMP-based planarization is performed. If the insulator 104 is etched to expose the etch stop members 113 in the step of FIG. 3B, the waveguide members 106a are arranged in contact with the etch stop members 113.

In the present exemplary embodiment, the material of the waveguide members 106a is deposited on the insulator 104 arranged in the peripheral circuit area. The portion of the material arranged in the peripheral circuit area is removed after the planarization and before the formation of the second member 107. Meanwhile, in the pixel area, the material of the waveguide members 106a is left on the insulator 104. In other words, the remaining material constitutes the connection member 106b. The removal of the connection member 106b from the peripheral circuit area facilitates the formation of openings 402 intended for the plugs 403 to be described below. Note that the material of the waveguide members 106a deposited on the peripheral circuit area need not be removed. If the material is left unremoved, the connection member 106b extends even to the peripheral circuit area.

Alternatively, the same material may be deposited a plurality of times to form the waveguide members 106a and the connection member 106b. Further, a plurality of different materials may be deposited in succession to form the waveguide members 106a and the connection member 106b. For example, the waveguide members 106a and the connection member 106b may be formed by initially depositing a silicon nitride film and then depositing an organic material having high embedding performance.

Figure 4A:
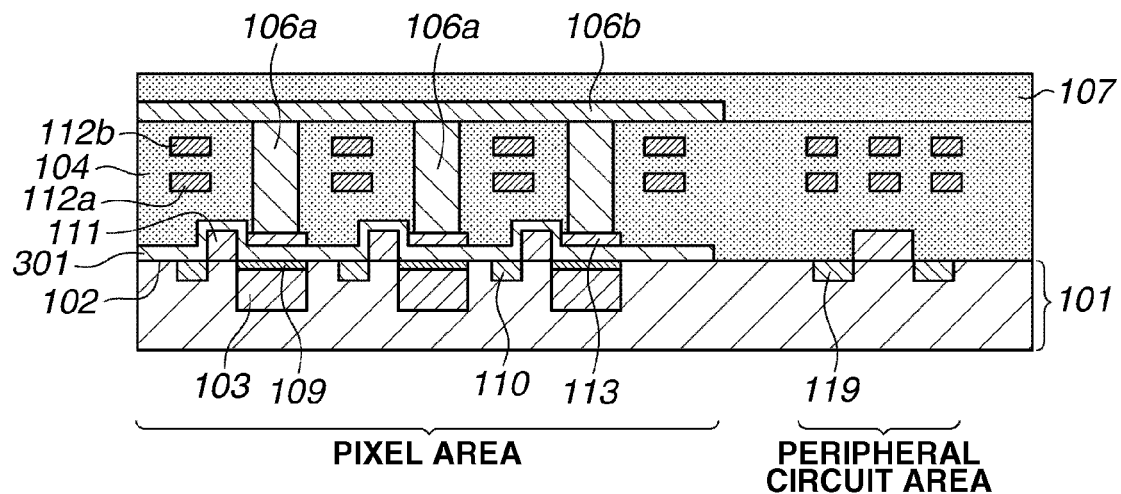
FIGS. 4A, 4B, and 4C are diagrams illustrating the method for manufacturing an imaging device according to the first and second exemplary embodiments.

FIG. 4A illustrates a step of forming the second member 107 on the insulator 104 and the plurality of waveguide members 106a. In the present exemplary embodiment, the second member 107 is formed on the connection member 106b. For example, a silicon oxide film is formed by CVD. A side of the second member 107 opposite from the semiconductor substrate 101 may be planarized by CMP.

Figure 4B:
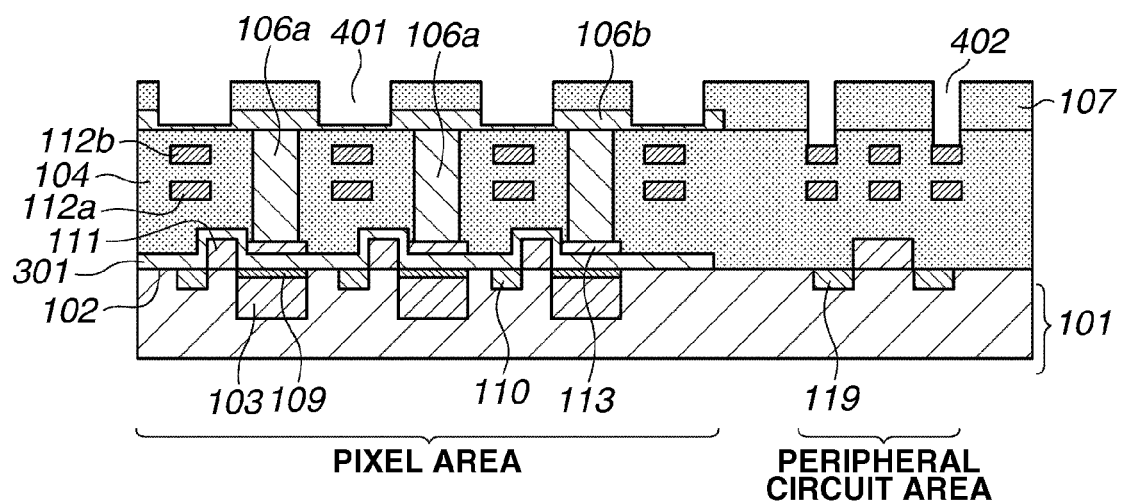

FIG. 4B illustrates a step of forming a plurality of openings 401 in the second member 107. In FIG. 4B, the openings 401 are formed in regions where the light shielding portions 108 are to be formed. In the present exemplary embodiment, the openings 402 are formed in the regions where the plugs 403 are to be formed. The plugs 403 are intended to electrically connect conductive members included in the second wiring layer 112b and conductive members included in the third wiring layer 112c. In the present exemplary embodiment, a formation method when the light shielding portions 108 contain tungsten will be described.

Initially, a not-illustrated etch mask pattern is formed on the second member 107. The etch mask pattern is arranged in regions other than where the openings 401 and 402 are to be arranged. In other words, the etch mask pattern has openings in the regions where the openings 401 and 402 are to be arranged. An example of the etch mask pattern is a photoresist patterned by photolithography and development.

The second member 107 is then etched by using the etch mask pattern as a mask. This forms the openings 401 and 402. After the etching of the second member 107, the etch mask pattern is removed. In the present exemplary embodiment, the openings 401 and 402 are simultaneously formed by using the connection member 106b as an etching stop during the formation of the openings 401. However, the openings 401 and 402 need not necessarily be formed at the same time.

Figure 4C:
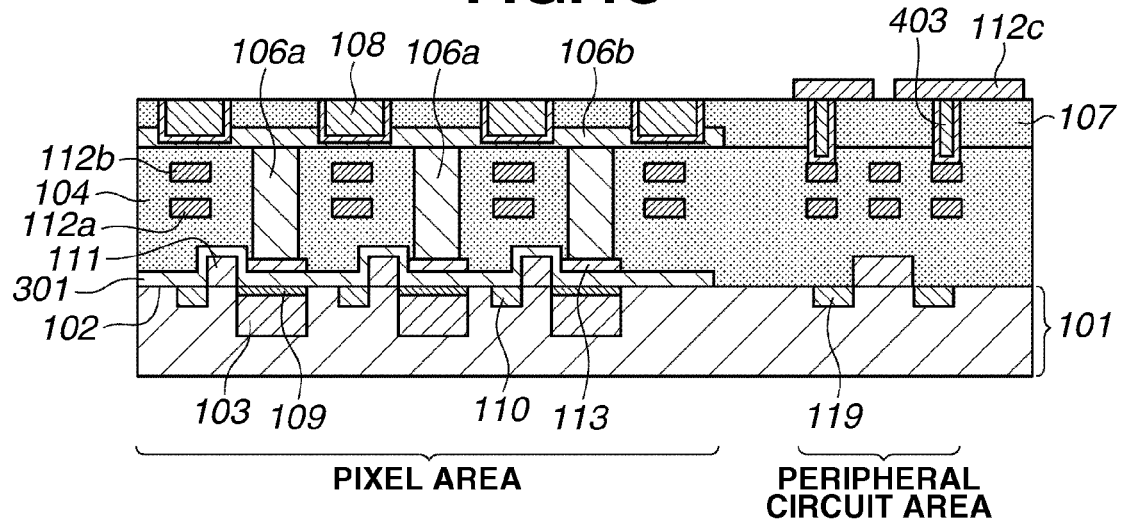

FIG. 4C illustrates a step of forming the light shielding portions 108 in the respective plurality of openings 401. More specifically, in FIG. 4C, the light shielding portions 108, the plugs 403, and the third wiring layer 112c are formed.

Initially, a metal film for forming the light shielding portions 108 and the plugs 403 is formed in the openings 401 and 402 and on the second member 107. If the light shielding portions 108 include a first portion and a second portion made of a barrier metal, a barrier metal layer is formed in the openings 401 and 402 and on the second member 107 before the formation of the metal film. In the present exemplary embodiment, the light shielding portions 108 and the plugs 403 each include a first portion mainly containing tungsten and a second portion mainly containing titanium nitride which is a barrier metal. The metal film and the barrier metal layer are then removed except inside the openings 401 and 402 by using a method such as CMP and etch back so that the second member 107, an underlayer, is exposed. In the present exemplary embodiment, the light shielding portions 108 and the plugs 403 are simultaneously formed for the sake of process simplification. However, the light shielding portions 108 and the plugs 403 need not necessarily be formed at the same time.

Next, for example, an aluminum film is formed on the pixel area and the peripheral circuit area. The aluminum film is etched to form the third wiring layer 112c. Although omitted in FIG. 4C, the light shielding portion 902 to be arranged on the light receiving portions 103 of the OB pixel area may be formed in the step of forming the third wiring layer 112c.

Figure 5A:
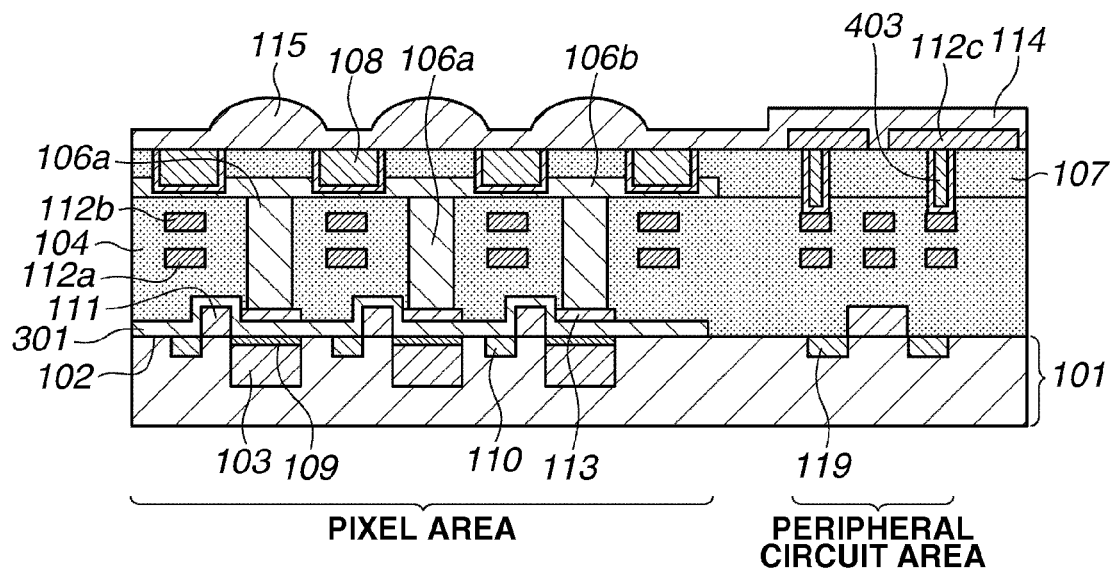
FIGS. 5A and 5B are diagrams illustrating the method for manufacturing an imaging device according to the first and second exemplary embodiments.

In FIG. 5A, the fourth member 114 and the first lenses 115 are formed. The fourth member 114 and the first lenses 115 are formed on a side of the second member 107 opposite from the semiconductor substrate 101. The first lenses 115 are arranged corresponding to the light receiving portions 103 of the pixel area. The fourth member 114 and the first lenses 115 can be formed by a conventional method.

Figure 5B:
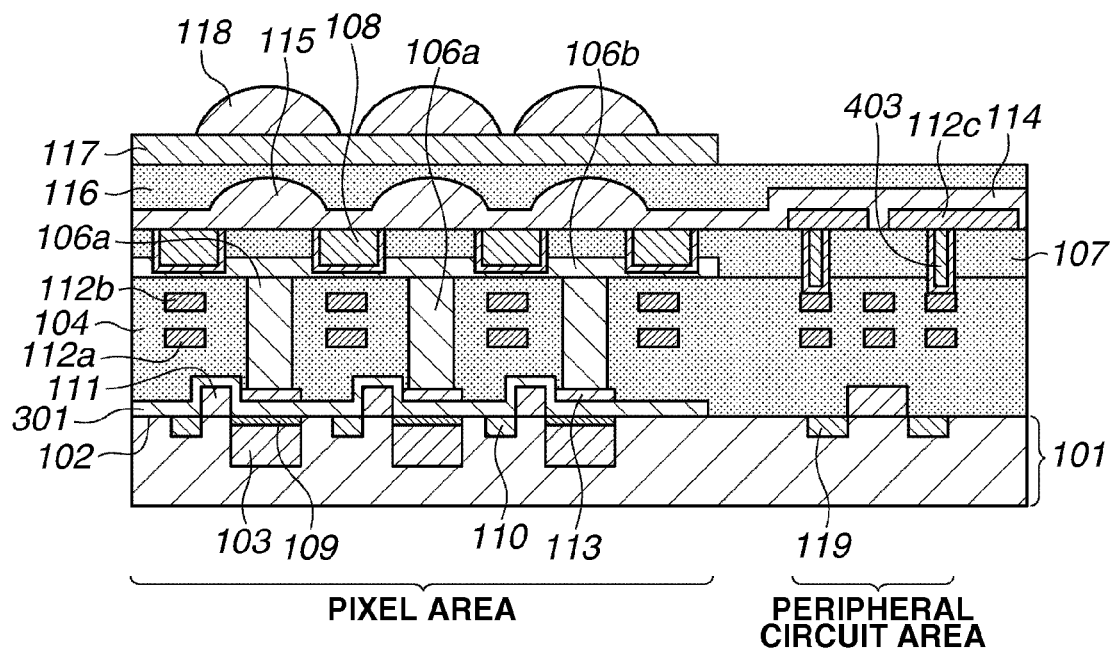

In FIG. 5B, the planarization film 116, the color filter 117, and the second lenses 118 are formed. Initially, the planarization film 116 is formed to cover the fourth member 114 and the first lenses 115. The planarization film 116 is an insulator. For example, the planarization film 116 is made of a polyimide system organic material. The color filter 117 and the second lenses 118 are then formed in positions corresponding to the light receiving portions 103.

As described above, in the present exemplary embodiment, the second member 107 having a refractive index lower than that of the waveguide members 106a is arranged on the insulator 104 and the plurality of waveguide members 106a. The light shielding portions 108 are arranged in the second member 107. Such a configuration can reduce the propagation of oblique light through a member having a high refractive index and the mixing of the light into the adjoining waveguide members 106a. As a result, the mixing of light into the adjoining light receiving portions 103 can be reduced.

In the present exemplary embodiment, the connection member 106b is arranged on the insulator 104 and the plurality of waveguide members 106a. The connection member 106b is arranged to connect two adjoining waveguide members 106a and has a refractive index higher than that of the insulator 104. The light shielding portions 108 are arranged on the connection member 106b. According to such a configuration, the incidence of light on the connection member 106b connecting the adjoining waveguide members 106a can be reduced. This can reduce the propagation of oblique light through the connection member 106 and the mixing of the light into the adjoining waveguide members 106a. As a result, the mixing of light into the adjoining light receiving portions 103 can be reduced.

In the present exemplary embodiment, the second member 107 is arranged on the insulator 104 and the plurality of waveguide members 106a. The third member (connection member 106b) having a refractive index higher than that of the second member 107 is arranged between the second member 107 and the plurality of waveguide members 106a. The light shielding portions 108 are arranged in the second member 107. According to such a configuration, the provision of the light shielding portions 108 in a low refractive index member arranged on a high refractive index member can reduce the incidence of light on the high refractive index member. This can reduce the propagation of oblique light through the high refractive index member and the mixing of the light into the adjoining waveguide members 106a. As a result, the mixing of light into the adjoining light receiving portions 103 can be reduced.

In the present exemplary embodiment, the second member 107 is arranged on the insulator 104 and the plurality of waveguide members 106a. The fourth member 114 having a refractive index different from that of the second member 107 is arranged on the second member 107. The light shielding portions 108 are arranged in the second member 117. The second member 107 and the light shielding portions 108 are both arranged in contact with the fourth member 114.

According to such a configuration, the second member 107 is not arranged between the light shielding portions 108 and the fourth member 114. If part of the second member 107 is arranged between the light shielding portions 108 and the fourth member 114, an interface between the fourth member 114 and the second member 107 is formed above the light shielding portions 108. Obliquely incident light may be refracted or reflected by such an interface and incident on the adjoining waveguide members 106a. As compared to the case where part of the second member 107 is arranged between the light shielding portions 108 and the fourth member 114, the mixing of light can thus be reduced. As a result, the mixing of light into the adjoining light receiving portions 103 can be reduced.

In the present exemplary embodiment, the light shielding portions 108 extend from the top surface to the bottom surface of the second member 107. This can further improve the effect of reducing the mixing of light.

A second exemplary embodiment will be described. The second exemplary embodiment deals with another exemplary embodiment of the present invention. The present exemplary embodiment differs from the first exemplary embodiment in the planar layout of the light shielding portions. In other respects, the present exemplary embodiment is similar to the first exemplary embodiment. The following description will deal only with differences from the first exemplary embodiment. A description of the other parts is omitted.

Figure 6:
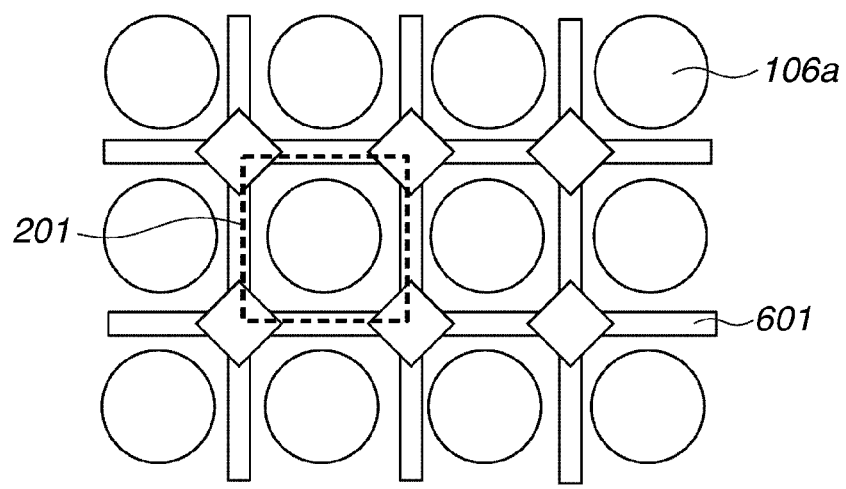
FIG. 6 is a schematic diagram illustrating a planar layout of an imaging device according to the second exemplary embodiment.

FIG. 6 is a schematic diagram illustrating a planar layout according to an imaging device of the present exemplary embodiment. FIG. 6 illustrates waveguide members 106a and light shielding portions 601. Portions having similar functions to those of FIG. 2 are designated by the same reference numerals. A detailed description thereof will be omitted.

In the present exemplary embodiment, each pixel 201 includes a light receiving portion 103 (not illustrated in FIG. 6) and a waveguide member 106a. The light shielding portions 601 are each arranged between two adjoining waveguide members 106a. In the present exemplary embodiment, the light shielding portions 601 are arranged in a lattice pattern. More specifically, the light shielding portions 601 are arranged so that the projections of the light shielding portions 601 on the semiconductor substrate 101 surround the projections of the waveguide members 106a on the semiconductor substrate 101. The light shielding portions 601 are arranged not only between waveguide members 106a arranged to adjoin in a vertical direction or horizontal direction, but also between waveguide members 106a arranged to adjoin in diagonal directions.

The OB pixel area according to the present exemplary embodiment has a cross-sectional structure similar to that of the first exemplary embodiment. In other words, FIG. 10 is a schematic cross-sectional view of the OB pixel area according to the present exemplary embodiment. A manufacturing method of the present exemplary embodiment is similar to that of the first exemplary embodiment. More specifically, the imaging device of the present exemplary embodiment can be formed by the manufacturing method illustrated in FIGS. 3A, 3B, and 3C to FIGS. 5A and 5B.

As has been described above, in the present exemplary embodiment, the light shielding portions 601 are arranged in a lattice pattern. Such a configuration can further reduce the leaking of light into the adjoining light receiving portions 103.

A third exemplary embodiment will be described. The third exemplary embodiment deals with another exemplary embodiment of the present invention. The present exemplary embodiment differs from the first exemplary embodiment in the manufacturing process for forming the light shielding portions and the second member. The following description will deal only with differences from the first exemplary embodiments. A description of the other parts is omitted.

A manufacturing method according to the present exemplary embodiment will be described with reference to FIGS. 7A, 7B, and 7C. In FIGS. 7A to 7C, portions having similar functions to those of FIGS. 3A, 3B, and 3C to FIGS. 5A and 5B are designated by the same reference numerals. A detailed description thereof will be omitted. The manufacturing method according to the present exemplary embodiment includes the steps illustrated in FIGS. 3A to 3C of the first exemplary embodiment. The steps up to FIG. 3C are the same as in the first exemplary embodiment. A detailed description thereof will be omitted.

In the present exemplary embodiment, after the step illustrated in FIG. 3C, light shielding portions 701 are formed on the connection member 106b. Initially, a film of the material of the light shielding portions 701 is formed on the pixel area and the peripheral circuit area. The film of the material of the light shielding portions 701 is partly etched to form the light shielding portions 701 arranged on the connection member 106b.

Next, in FIG. 7B, a second member 702 is formed. The second member 702 is formed on a side of the light shielding portions 701, the waveguide members 106a, and the connection member 106b opposite from the semiconductor substrate 101. An example of the second member 702 is a silicon oxide film formed by CVD. A surface of the second member 702 on the side opposite from the semiconductor surface 101 may be planarized by CMP.

Subsequently, in FIG. 7C, the third wiring layer 112c, the fourth member 114, the first lenses 115, the planarization film 116, the color filter 117, and the second lenses 118 are formed by the same processes as the steps of the first exemplary embodiment.

The imaging device of the present exemplary embodiment formed by the foregoing manufacturing method will be described. In the present exemplary embodiment, the light shielding portions 701 are arranged at least in part in the second member 702. More specifically, when seen in a cross section, the light shielding portions 701 are each arranged sandwiched between two portions of the second member 702. The light shielding portions 701 are made of a metal, alloy, or organic material that does not transmit light. The material of the light shielding portions 701 may have a high reflectance to light having a wavelength of 400 to 600 nm. In the present exemplary embodiment, the light shielding portions 701 contain tungsten. The light shielding portions 701 may be made of the same material as that of the plugs 403 which electrically connect conductive members included in the second wiring layer 112b and conductive members included in the third wiring layer 112c. If the light shielding portions 701 and the plugs 403 are made of the same material, both can be formed by the same step to cause process to be simple. In the present exemplary embodiment, the light shielding portions 701 and the plugs 403 are made of the same material but formed in separate steps. The light shielding portions 701 are formed before the formation of the second member 702. The plugs 403 are formed after the formation of the second member 702.

In the present exemplary embodiment, the light shielding portions 701 each include a first portion made of a metal or alloy, and a second portion. The second portion is arranged to reduce diffusion of the metal included in the first portion. Specifically, the second portion has a diffusion coefficient lower than that of the insulator 104 with respect to the diffusion of the metal included in the first portion. The second portion may be made of a barrier metal, as it is called. The plugs 403 may also include a first portion and a second portion each. In the present exemplary embodiment, both the light shielding portions 701 and the plugs 403 include a first portion mainly containing tungsten and a second portion mainly containing titanium nitride which is a barrier metal.

As illustrated in FIG. 7C, in the present exemplary embodiment, part of the second member 702 is arranged between the light shielding portions 701 and the fourth member 114.

As has been described above, in the present exemplary embodiment, the second member 702 having a refractive index lower than that of the waveguide members 106a is arranged on the insulator 104 and the plurality of waveguide members 106a. The light shielding portions 701 are arranged in the second member 702. Such a configuration can reduce the propagation of oblique light through a member having a high refractive index and the mixing of the light into the adjoining waveguide members 106a. As a result, the mixing of light into the adjoining light receiving portions 103 can be reduced.

In the present exemplary embodiment, the connection member 106b is arranged on the insulator 104 and the plurality of waveguide members 106a. The connection member 106b is arranged to connect two adjoining waveguide members 106a and has a refractive index higher than that of the insulator 104. The light shielding portions 701 are arranged on the connection member 106b. According to such a configuration, the incidence of light on the connection member 106b connecting the adjoining waveguide members 106a can be reduced. This can reduce the propagation of oblique light through the connection member 106b and the mixing of the light into the adjoining waveguide members 106a. As a result, the mixing of light into the adjoining light receiving portions 103 can be reduced.

In the present exemplary embodiment, the second member 702 is arranged on the insulator 104 and the plurality of waveguide members 106a. The third member (connection member 106b) having a refractive index higher than that of the second member 702 is arranged between the second member 702 and the plurality of waveguide members 106a. The light shielding portions 701 are arranged in the second member 702. According to such a configuration, the provision of the light shielding portions 701 in the low refractive index member arranged on the high refractive index member can reduce the incidence of light on the high refractive index member. This can reduce the propagation of oblique light through the high refractive index member and the mixing of the light into the adjoining waveguide members 106a. As a result, the mixing of light into the adjoining light receiving portions 103 can be reduced.

A fourth exemplary embodiment will be described. The fourth exemplary embodiment deals with another exemplary embodiment of the present invention. The present exemplary embodiment differs from the first exemplary embodiment in that no connection member is arranged on the insulator 104. In other respects, the present exemplary embodiment is similar to the first exemplary embodiment. The following description will deal only with differences from the first exemplary embodiment. A description of the parts similar to those of the first exemplary embodiment is omitted.

Figure 8:
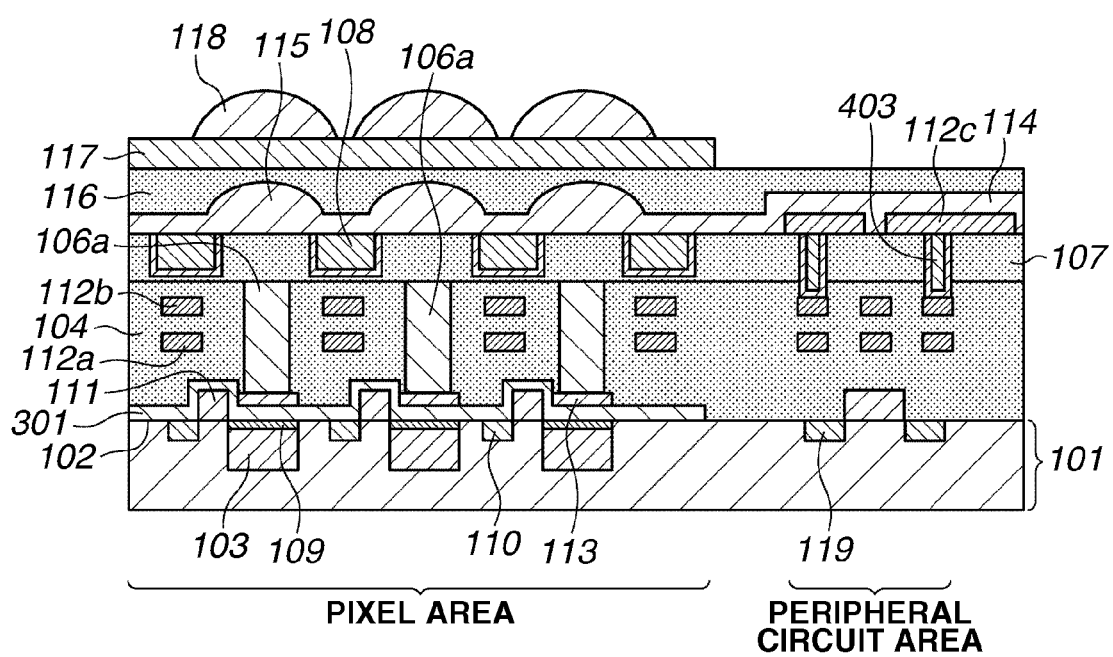
FIG. 8 is a schematic diagram illustrating a cross-sectional structure of an imaging device according to a fourth exemplary embodiment.

FIG. 8 is a schematic diagram illustrating a cross-sectional structure of an imaging device according to the present exemplary embodiment. In FIG. 8, portions having similar functions to those of FIG. 1 are designated by the same reference numerals. A detailed description thereof will be omitted. As illustrated in FIG. 8, no member containing the same material as that of the waveguide members 106a is arranged on the insulator 104. The insulator 104 and the second member 107 are thus arranged in contact with each other.

In the present exemplary embodiment, the second member 107 is arranged on the insulator 104 and the plurality of waveguide members 106a. The second member 107 has a refractive index lower than that of the waveguide members 106a. The light shielding portions 108 are arranged at least in part in the second member 107. In other words, when seen in a cross section, the light shielding portions 108 are each arranged between two portions of the second member 107.

The fourth member 114 is arranged on the light shielding portions 108 and the second member 107. The fourth member 114 has a refractive index different from that of the second member 107. The light shielding portions 108 and the second member 107 are both arranged in contact with the fourth member 114.

Figure 11:
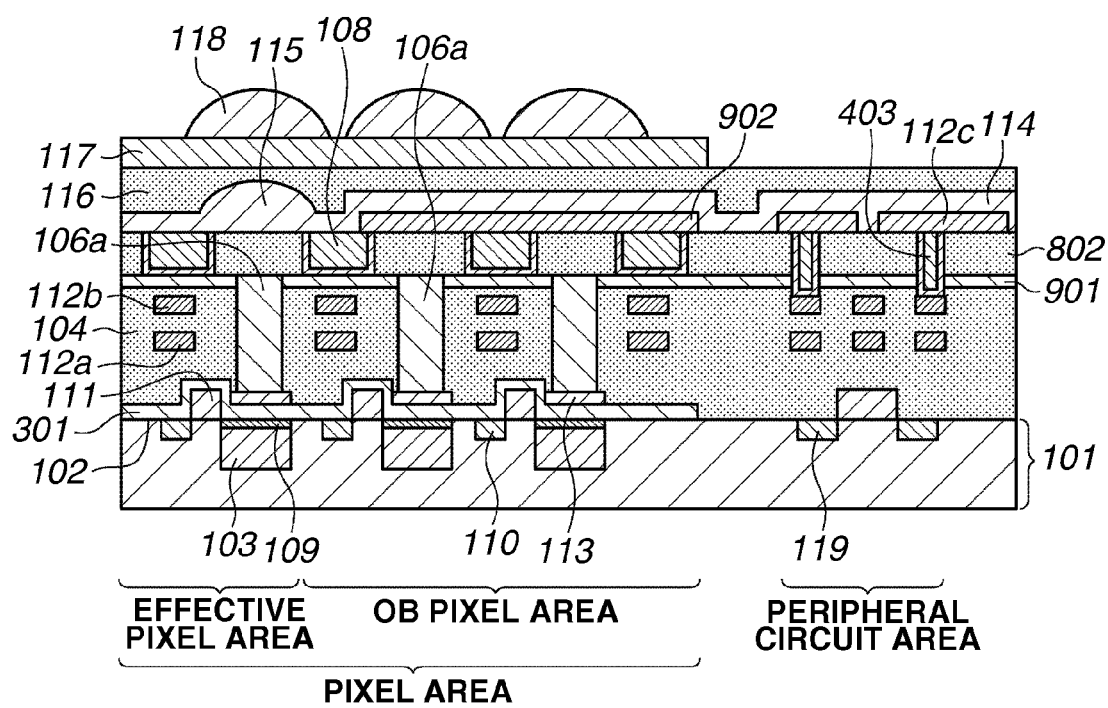
FIG. 11 is a schematic diagram illustrating a cross-sectional structure of the imaging device according to the fourth exemplary embodiment.

FIG. 11 is a schematic diagram illustrating a cross-sectional structure of another part of the imaging device according to the present exemplary embodiment. Portions having similar functions to those of FIG. 8 are designated by the same reference numerals. The pixel area according to the present exemplary embodiment includes an effective pixel area and an OB pixel area. FIG. 11 illustrates a cross section of a pixel included in the effective pixel area and a cross section of pixels included in the OB pixel area.

The OB pixel area includes optical black pixels. Specifically, a light shielding portion 902 is arranged over the light receiving portions 103 of the pixels included in the OB pixel area. The light shielding portion 902 shields the light receiving portions 103 of the pixels included in the OB pixel area from incident light. The light shielding portion 902 is made of the conductive material included in the third wiring layer 112c. Note that the OB pixel area is provided according to need. The pixel area need not include the OB pixel area.

Figure 9A:
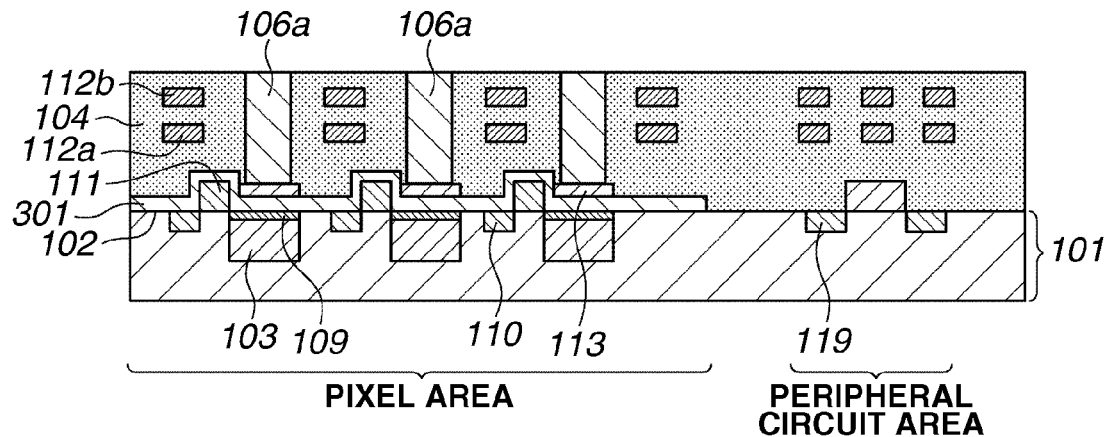
FIGS. 9A, 9B, and 9C are diagrams illustrating a method for manufacturing the imaging device according to the fourth exemplary embodiment.
Figure 9B:
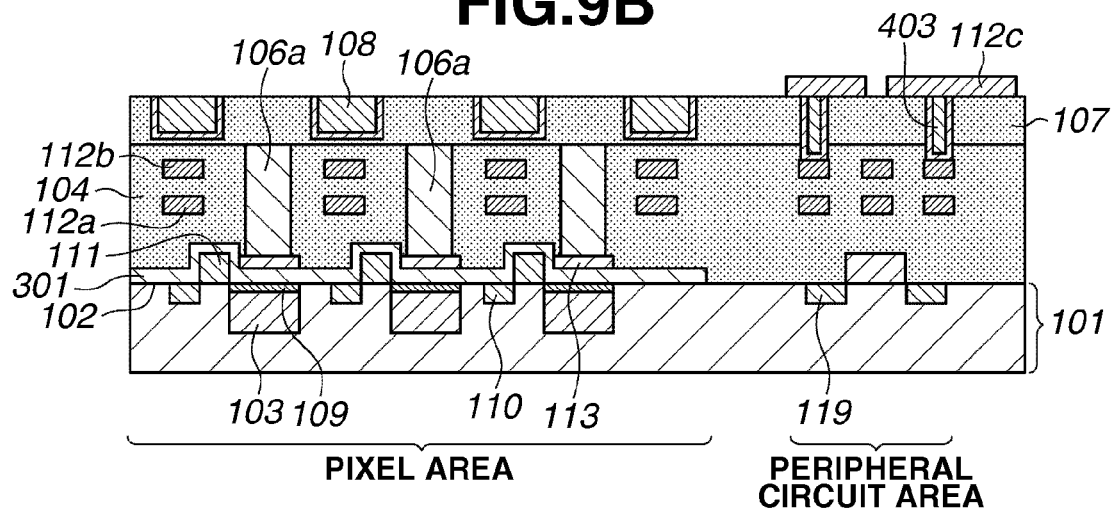
Figure 9C:
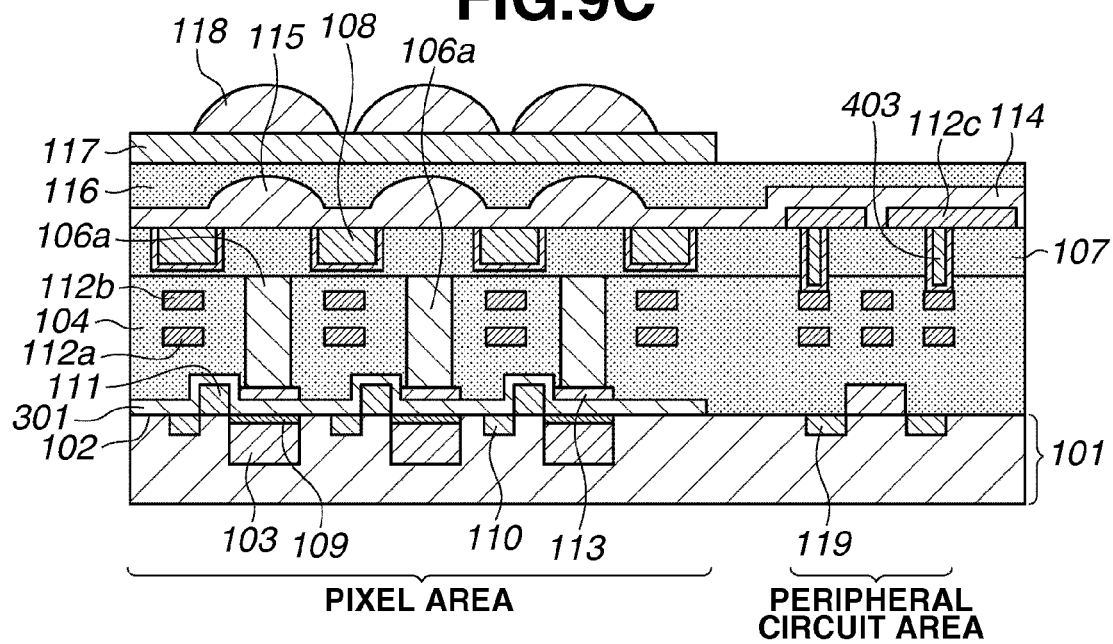

FIG. 11 illustrates an example where there is arranged an etch stop film 901. The etch stop film 901 is arranged on the insulator 104 between adjoining waveguide members 106a. The etch stop film 901 and the light shielding portions 108 are arranged in contact with each other. The etch stop film 901 has both a function as a stopper when removing the material of the waveguide members 106a deposited on the insulator 104 and a function as stopper when forming the openings 401 intended for the light shielding portions 108 in manufacturing processes to be described below. The etch stop film 901 is provided according to need. As illustrated in FIGS. 9A, 9B, and 9C, the etch stop film 901 may be omitted.

The light shielding portions 108 have a planar layout similar to that of the first or second exemplary embodiment. In other words, FIG. 2 or 6 illustrates the planar layout of the light shielding portions 108 according to the present exemplary embodiment. A detailed description will be omitted.

Next, a manufacturing process according to the present exemplary embodiment will be described with reference to FIGS. 9A to 9C. In FIGS. 9A to 9C, portions having similar functions to those of FIGS. 1 to 8 or FIG. 11 are designated by the same reference numerals. A detailed description thereof is omitted. A manufacturing method according to the present exemplary embodiment includes the steps illustrated in FIGS. 3A and 3B of the first exemplary embodiment. The steps up to FIG. 3B are similar to those of the first exemplary embodiment. A detailed description thereof will be omitted.

In the step illustrated in FIG. 9A, the waveguide members 106a are formed in the respective plurality of openings 105. The material of the waveguide members 106a is initially deposited on the pixel area and the peripheral circuit area. As a result, the material of the waveguide members 106a is deposited in the openings 105 and on the insulator 104. An example of the material of the waveguide members 106a is a silicon nitride film. The material of the waveguide members 106a can be deposited by film formation such as CVD and sputtering, or by application of organic material such as a polyimide system polymer.

If the insulator 104 is etched to expose the etch stop members 113 in the step of FIG. 3B, the waveguide members 106a are arranged in contact with the etch stop member 113. The same material may be deposited a plurality of times to form the waveguide members 106a. A plurality of different materials may be formed in succession to form the waveguide members 106a. For example, the waveguide members 106a may be formed by initially depositing a silicon nitride film and then depositing an organic material having high embedding performance.

In the present exemplary embodiment, portions of the deposited film of the material of the waveguide members 106a arranged on the insulator 104 are removed. In the first exemplary embodiment, in the step of FIG. 3C, the material of the waveguide members 106a is planarized by CMP so that the connection member 106b remains. In contrast, according to the present exemplary embodiment, the material of the waveguide members 106a is subjected to CMP until the underlayer is exposed. In the present exemplary embodiment, there is thus formed no connection member 106b. The material of the waveguide members 106a may be removed by polishing or etching.

If the material of the waveguide members 106a is deposited in contact with the insulator 104, the CMP is performed until the insulator 104 is exposed. The CMP condition for removing the material of the waveguide members 106a may be such that the insulator 104 has a polishing rate lower than that of the material of the waveguide members 106a. In other words, the insulator 104 may have a function as a CMP stopper.

Alternatively, if the etch stop film 901 is arranged as illustrated in FIG. 11, the CMP is performed until the etch stop film 901 is exposed. The CMP condition for removing the material of the waveguide members 106a may be such that the etch stop film 901 has a polishing rate lower than that of the material of the waveguide members 106a. In such a case, the etch stop film 901 functions as a CMP stopper.

In the step illustrated in FIG. 9B, the second member 107, the light shielding portions 108 arranged in the second member 107, the plugs 403, and the third wiring layer 112c are formed on the waveguide members 106a. A method for forming such components is similar to the steps of FIGS. 4A to 4C according to the first exemplary embodiment or the steps of FIGS. 7A to 7C according to the third exemplary embodiment. A detailed description will thus be omitted.

If the etch stop film 901 is arranged as illustrated in FIG. 11, the etch stomp film 901 may function as a stopper during the formation of the openings 401. The etch stop film 901 thus has both functions as a CMP stopper and a stopper during the formation of the openings 401.

In the step illustrated in FIG. 9C, the fourth member 114, the first lenses 115, the planarization film 116, the color filter 117, and the second lenses 118 are formed by a process similar to the steps of the first exemplary embodiment.

As has been described above, in the present exemplary embodiment, the second member 107 having a refractive index lower than that of the waveguide members 106a is arranged on the insulator 104 and the plurality of waveguide members 106a. The light shielding portions 108 are arranged in the second member 107. Such a configuration can reduce the propagation of oblique light through a member having a high refractive index and the mixing of the light into the adjoining waveguide members 106a. As a result, the mixing of light into the adjoining light receiving portions 103 can be reduced.

In the present exemplary embodiment, the connection member 106b is arranged on the insulator 104 and the plurality of waveguide members 106a. The connection member 106b is arranged to connect two adjoining waveguide members 106a and has a refractive index higher than that of the insulator 104. The light shielding portions 108 are arranged on the connection member 106b. According to such a configuration, the incidence of light on the connection member 106b connecting the adjoining waveguide members 106a can be reduced. This can reduce the propagation of oblique light through the connection member 106 and the mixing of the light into the adjoining waveguide members 106a. As a result, the mixing of light into the adjoining light receiving portions 103 can be reduced.

In the present exemplary embodiment, the second member 107 is arranged on the insulator 104 and the plurality of waveguide members 106a. The third member (connection member 106b) having a refractive index higher than that of the second member 107 is arranged between the second member 107 and the plurality of waveguide members 106a. The light shielding portions 108 are arranged in the second member 107. According to such a configuration, the provision of the light shielding portions 108 in a low refractive index member arranged on a high refractive index member can reduce the incidence of light on the high refractive index member. This can reduce the propagation of oblique light through the high refractive index member and the mixing of the light into the adjoining waveguide members 106a. As a result, the mixing of light into the adjoining light receiving portions 103 can be reduced.

In the present exemplary embodiment, the second member 107 is arranged on the insulator 104 and the plurality of waveguide members 106a. The fourth member 114 having a refractive index different from that of the second member 107 is arranged on the second member 107. The light shielding portions 108 are arranged in the second member 107. The second member 107 and the light shielding portions 108 are both arranged in contact with the fourth member 114.

According to such a configuration, the second member 107 is not arranged between the light shielding portions 108 and the fourth member 114. If part of the second member 107 is arranged between the light shielding portions 108 and the fourth member 114, an interface between the fourth member 114 and the second member 107 is arranged above the light shielding portions 108. Obliquely incident light may be refracted or reflected by the interface and incident on the adjoining waveguide members 106a. As compared to when part of the second member 107 is arranged between the light shielding portions 108 and the fourth member 114, the mixing of light can thus be reduced. As a result, the mixing of light into the adjoining light receiving portions 103 can be reduced.

Figure 12:
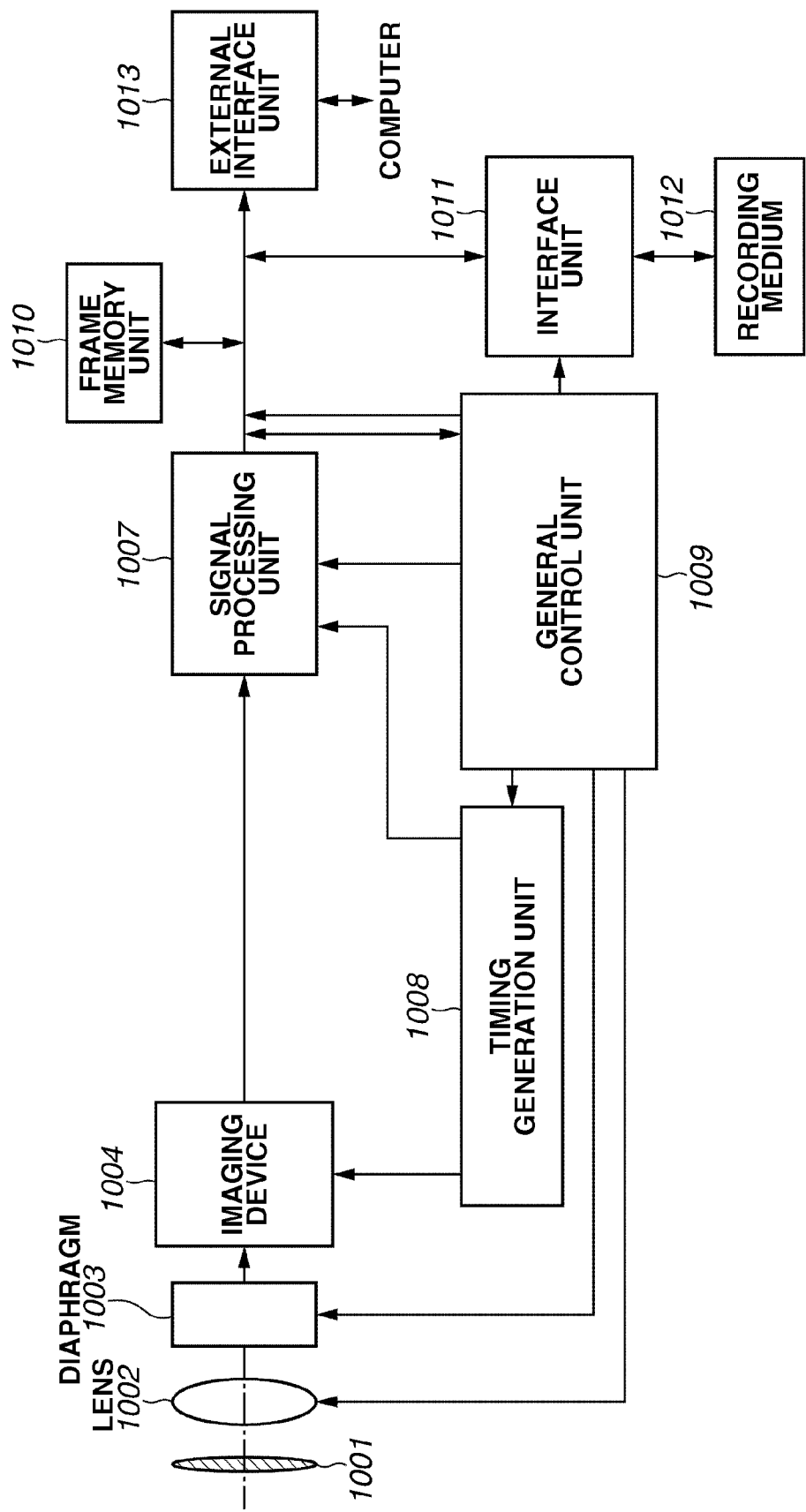
FIG. 12 is a block diagram of an imaging system according to a fifth exemplary embodiment of the present invention.

A fifth exemplary embodiment will be described. The fifth exemplary embodiment deals with an exemplary embodiment of an imaging system according to the present invention. Examples of the imaging system include a digital still camera, a digital camcorder, a copying machine, a facsimile, a mobile phone, a car-mounted camera, and an observation satellite. FIG. 12 illustrates a block diagram of a digital still camera as an example of the imaging system.

In FIG. 12, a barrier 1001 protects a lens 1002. The lens 1002 forms an optical image of an object on an imaging device 1004. A diaphragm 1003 varies the amount of light passed through the lens 1002. The imaging device 1004 is an imaging device described in any one of the foregoing exemplary embodiments. The imaging device 1004 converts the optical image formed by the lens 1002 into image data. An analog-to-digital (AD) conversion unit is formed on the semiconductor substrate of the imaging device 1004. A signal processing unit 1007 makes various corrections to captured data output by the imaging device 1004, and performs data compression. In FIG. 12, a timing generation unit 1008 outputs various timing signals to the imaging device 1004 and the signal processing unit 1007. A general control unit 1009 controls the entire digital still camera. A frame memory unit 1010 temporarily stores image data. An interface unit 1011 is intended to perform recording and/or reading on a recording medium 1012. The recording medium 1012 is a detachably attached semiconductor memory for captured data to be recorded on and/or read from. An interface unit 1013 is intended to communicate with an external computer. The timing signals and the like may be input from outside the imaging system. The imaging system needs to include at least the imaging device 1004 and the signal processing unit 1007 which processes an imaging signal output from the imaging device 1004.

In the present exemplary embodiment, the imaging device 1004 and the AD conversion unit are described to be formed on the same semiconductor substrate. However, the imaging device 1004 and the AD conversion unit may be formed on different semiconductor substrates. Further, the imaging device 1004 and the imaging processing unit 1007 may be formed on the same substrate.

In the present exemplary embodiment, the imaging device 1004 is any one of the imaging devices according to the first to fourth exemplary embodiments. Any one of the imaging devices according to the first to fourth exemplary embodiments can thus be applied to an imaging system. The application of the exemplary embodiments according to the present invention to the imaging system can improve image quality.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions This application claims the benefit of Japanese Patent Application No. 2012-174843 filed Aug. 7, 2012, which is hereby incorporated by reference herein in its entirety.

What is claimed is:

1. An imaging device comprising:
a substrate in which a plurality of light receiving portions is arranged;
an insulator arranged on the substrate;
a plurality of first members arranged on the substrate so that a projection of each of the plurality of first members onto the substrate at least partially overlaps with any of the plurality of light receiving portions, each of the plurality of first members being surrounded by the insulator;
a second member arranged on the insulator and the plurality of first members; and
a light shielding portion arranged in the second member.

2. The imaging device according to claim 1, wherein a refractive index of the second member is lower than that of the first members.

3. The imaging device according to claim 2, further comprising:
a third member arranged between the second member and the insulator and between the second member and the plurality of first members, a refractive index of the third member being higher than both that of the second member and that of the insulator; and
a fourth member arranged on the second member and having a refractive index different from the refractive index of the second member,
wherein the plurality of first members have a refractive index higher than that of the insulator, and
wherein the second member and the light shielding portion are both arranged in contact with the fourth member.

4. The imaging device according to claim 1, further comprising a third member arranged between the second member and the insulator and between the second member and the plurality of first members, a refractive index of the third member being higher than that of the second member.

5. The imaging device according to claim 1, further comprising a fourth member arranged on the second member and having a refractive index different from that of the second member,
wherein the second member and the light shielding portion are both arranged in contact with the fourth member.

6. The imaging device according to claim 1, further comprising a plurality of wiring layers arranged on the substrate,
wherein the insulator includes a plurality of insulating films, each being arranged between the plurality of wiring layers.

7. The imaging device according to claim 6, wherein the light shielding portion is closer to the substrate than a wiring layer farthest from the substrate among the plurality of wiring layers is close to.

8. The imaging device according to claim 6, wherein the light shielding portion is made of the same material as that of a conductive member configured to electrically connect two wiring lines included in different wiring layers to each other.

9. The imaging device according to claim 1, further comprising a second light shielding portion configured to shield some of the plurality of light receiving portions,
wherein a distance from the substrate to the light shielding portion arranged in the second member is smaller than a distance from the substrate to the second light shielding portion.

10. The imaging device according to claim 9, wherein a distance from the substrate to a top surface of the light shielding portion arranged in the second member is equal to or greater than a distance from the substrate to a bottom surface of the second light shielding portion.

11. The imaging device according to claim 1, wherein the light shielding portion is arranged in a lattice pattern so that a projection of the light shielding portion onto the substrate surrounds the projection of each of the first members onto the substrate.

12. The imaging device according to claim 1, wherein the light shielding portion includes a first portion made of a metal or an alloy thereof, and a second portion made of a material having a diffusion coefficient with respect to the metal lower than a diffusion coefficient with respect to the metal of the second member.

13. The imaging device according to claim 1, further comprising a plurality of lenses configured to be arranged on the second member,
wherein the plurality of lenses is made of a material having a refractive index higher than that of the second member.

14. The imaging device according to claim 5, wherein the refractive index of the fourth member is higher than the refractive index of the second member, and
wherein the fourth member constitutes a plurality of lenses.

15. The imaging device according to claim 1, wherein each of the plurality of first members constitutes an optical waveguide for guiding light to a corresponding one of the plurality of light receiving portions.

16. The imaging device according to claim 1, wherein the light shielding portion is arranged so that a projection of the light shielding portion onto the substrate at least partially overlaps with a projection, onto the substrate, of a portion of the insulator arranged between two adjoining first members among the plurality of first members.

17. An imaging system comprising:
the imaging device according to claim 1; and
a signal processing unit configured to process a signal from the imaging device.

18. An imaging device comprising:
a substrate in which a plurality of light receiving portions is arranged;
an insulator arranged on the substrate;
a plurality of first members arranged on the substrate so that a projection of each of the plurality of first members onto the substrate at least partially overlaps with any of the plurality of light receiving portions, each of the plurality of first members sides being surrounded by the insulator, and a refractive index of the plurality of first members being higher than that of the insulator;
a connection member arranged on the insulator so as to connect two adjoining first members among the plurality of first members, a refractive index of the connection member being higher than that of the insulator; and
a light shielding portion arranged on the connection member.

19. The imaging device according to claim 18, wherein the plurality of first members and the connection member are made of the same material.

* * * * *